United States Patent [19]

Murayama et al.

[11] Patent Number: 5,297,212
[45] Date of Patent: Mar. 22, 1994

[54] LOUDSPEAKER SYSTEM INSTALLED ON AN AUTOMOBILE DOOR AND INCLUDING A WOOFER AND A TWEETER

[75] Inventors: Fumio Murayama; Takashi Suzuki, both of Yamagata, Japan

[73] Assignee: Pioneer Electronic Corporation, Tokyo, Japan

[21] Appl. No.: 361,662

[22] Filed: May 31, 1989

Related U.S. Application Data

[63] Continuation of Ser. No. 154,549, Feb. 10, 1988, abandoned.

[30] Foreign Application Priority Data

Feb. 14, 1987 [JP] Japan .............................. 67-20591[U]

[51] Int. Cl.⁵ ................................................. H03G 5/00
[52] U.S. Cl. ........................................ 381/86; 381/24; 381/99; 381/103
[58] Field of Search ................... 381/86, 24, 68.2, 98, 381/99, 100, 103; 455/319, 320

[56] References Cited

U.S. PATENT DOCUMENTS

| | | | |
|---|---|---|---|
| 2,308,931 | 1/1943 | Penn | 381/68.2 |
| 3,457,370 | 7/1969 | Boner | 381/99 |
| 4,015,089 | 3/1977 | Ishii | 381/99 |
| 4,229,618 | 10/1980 | Gamble | 381/99 |
| 4,475,233 | 10/1984 | Watkins | 381/99 |
| 4,593,405 | 6/1986 | Frye | 381/99 |
| 4,606,071 | 8/1986 | White | 381/99 |

FOREIGN PATENT DOCUMENTS

| | | | |
|---|---|---|---|
| 45210 | 3/1980 | Japan | 381/99 |
| 2145904 | 4/1985 | Japan | 381/99 |

*Primary Examiner*—Tommy P. Chin
*Attorney, Agent, or Firm*—Sughrue, Mion, Zinn, Macpeak & Seas

[57] ABSTRACT

In a mobile loudspeaker system comprising a woofer and a tweeter. A resonance circuit is inserted in the network of the woofer so that the frequency characteristic of sound pressure inside the vehicle at a middle-frequency range is substantially flat.

4 Claims, 3 Drawing Sheets

LOUDSPEAKER SYSTEM INSTALLED ON AN AUTOMOBILE DOOR AND INCLUDING A WOOFER AND A TWEETER

This is a continuation of application Ser. No. 07/154,549, filed Feb. 10, 1988, now abandoned.

BACKGROUND OF THE INVENTION

This invention relates to a mobile loudspeaker system.

A conventional loudspeaker system that is installed on an automobile door is shown in FIG. 7. There, an input signal in is applied through a filter consisting of an inductance element L1 and a capacitor C1 to a woofer 1. The input signal also is applied through a filter consisting of an inductance element L2 and a capacitor C2 to a tweeter 2.

The circuit of the woofer 1 is adapted to reproduce middle and low frequency signals; accordingly, the input signal is high-cut with $-12$ dB/oct (or $-6$ dB/oct) above a given frequency. The circuit of the tweeter 2 is adapted to reproduce high frequency signals and the input is high-passed with 12 dB/oct (or 6 dB/oct) below a given frequency.

However, if such loudspeaker system, having an output frequency response that is flat, is installed on a vehicle door or doors, as is shown in FIG. 8 the frequency characteristic of the sound pressure inside the vehicle shows a peak in a frequency range of from 1.5 KHz to 3 KHz. For listening comfort, it is desirable to have a flat sound pressure characteristic across the entire frequency range.

SUMMARY OF THE INVENTION

Accordingly, an object of this invention is to eliminate the above-described difficulty accompanying a conventional mobile loudspeaker system.

More specifically, an object of the invention is to provide a mobile loudspeaker system in which the sound pressure level, when increased in the middle frequency range, is suppressed so that the sound pressure characteristic inside the vehicle is substantially flat.

The foregoing object and other objects of the invention have been achieved by the provision of a mobile loudspeaker system which, according to the invention, comprises: a resonance circuit connected to the network system of a middle/low frequency loudspeaker to suppress the output level thereof in the middle frequency range in frequency response.

The nature, principle and utility of the invention will become more apparent from the following detailed description when read in conjunction with the accompanying drawings.

DETAILED DESCRIPTION OF THE INVENTION

This invention will be described with reference to its preferred embodiments.

Figure 1:
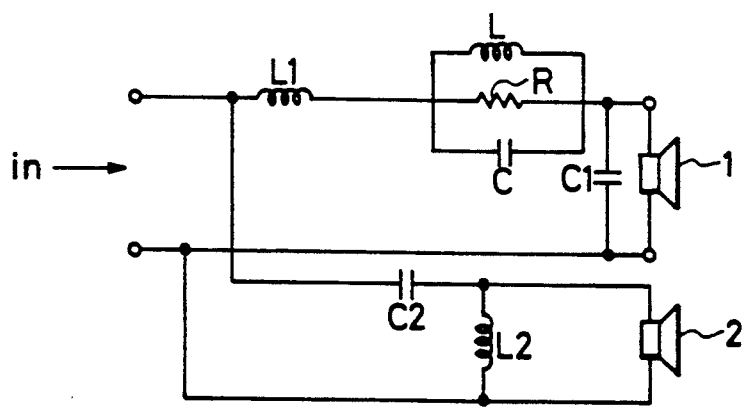
FIG. 1 is a circuit diagram showing a first example of a mobile loudspeaker system according to this invention.

A first embodiment of a mobile loudspeaker system according to the invention is shown in FIG. 1. Those circuit elements which have been previously described with reference to FIG. 7 are designated by the same reference numerals or characters.

Figure 7:
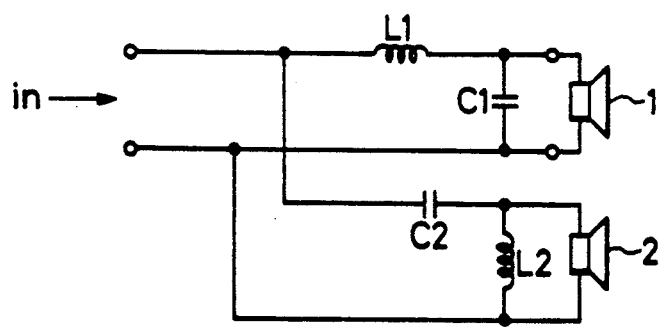
FIG. 7 is a circuit diagram showing a conventional mobile loudspeaker system.
Figure 8:
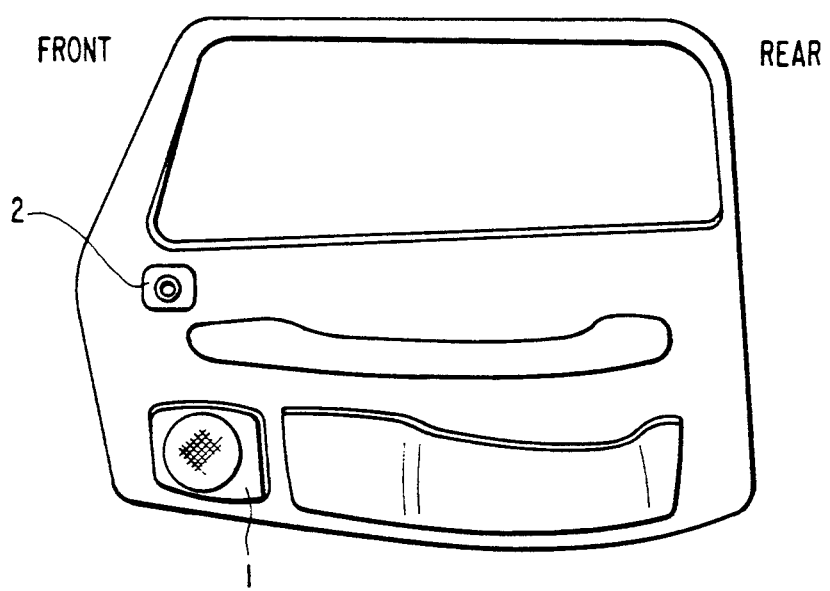
FIG. 8 is a view of the speakers mounted on a vehicle door (in this case, the right door) in the passenger compartment of a vehicle.

As is apparent from comparison of FIG. 1 with FIG. 7, the circuit of FIG. 1 is obtained by insertion of a parallel circuit comprising an inductance element (or choke coil) L, a resistor R and a capacitor C. This resonance circuit is connected between the inductance element L1 and the capacitor C1 in the circuit of FIG. 7. The components of the resonance circuit are selected to provide a resonance frequency in a frequency band of 1.5 KHz to 3 KHz. The remainder of the circuit in FIG. 1 is the same as that of the circuit of FIG. 7. That is, the resonance circuit is connected into the circuit for the woofer 1, which is a middle/low frequency loudspeaker having a transfer characteristic of $-12$ dB/oct based upon the selected parameters of the inductance element (choke coil) L1 and the capacitor C1.

Figure 2:
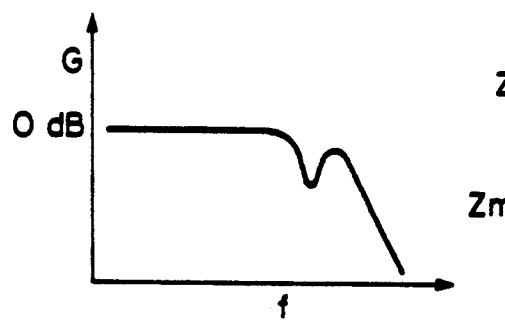
FIG. 2 is a graphical representation indicating the transfer characteristic of only the woofer circuit in the system of FIG. 1.
Figure 3:
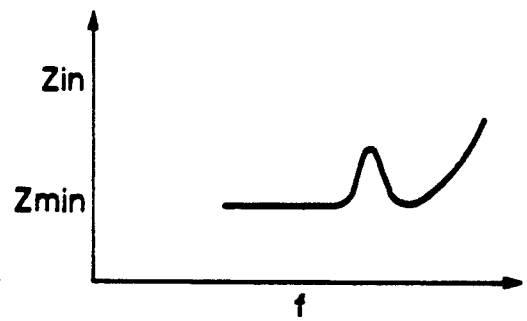
FIG. 3 is a graphical representation indicating the impedance characteristic of only the woofer circuit in the system of FIG. 1.

Because the resonance circuit is inserted in the woofer circuit, as described above, the impedance of the circuit is raised at the resonance frequency. Accordingly, the input to the woofer 1 is decreased at that frequency. As a result, the transfer characteristic and the impedance characteristic of the network system of the woofer 1 are as shown in FIGS. 2 and 3, respectively. Specifically, the frequency characteristic of sound pressure inside the vehicle is made flat in the middle frequency range.

Figure 4:
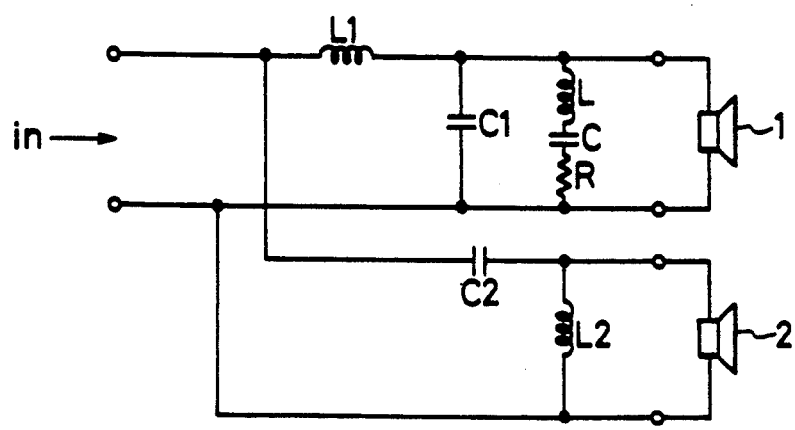
FIG. 4 is a circuit diagram showing a second example of the mobile loudspeaker system according to the invention.
Figure 5:
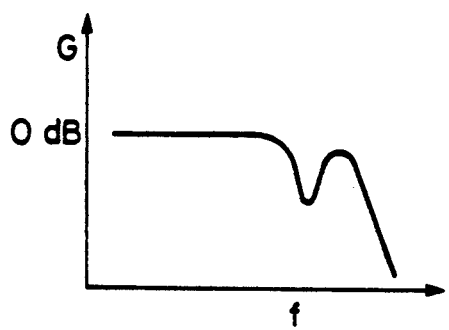
FIG. 5 is a graphical representation indicating the transfer characteristic of only the woofer circuit in the system of FIG. 4.
Figure 6:
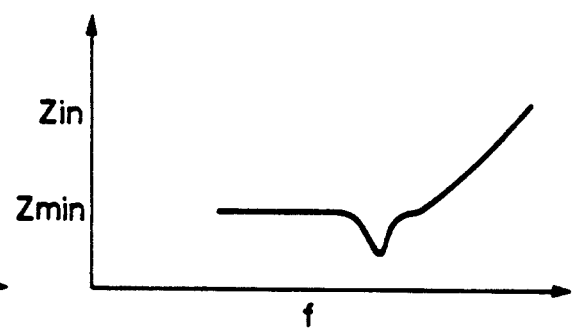
FIG. 6 is a graphical representation indicating the impedance characteristic of only the woofer circuit in the system of FIG. 4.

In the circuit of FIG. 1, the resonance circuit connected to the high-cut dividing network is the parallel resonance circuit consisting of the inductance element L, the resistor R and the capacitor C. An alternative embodiment is shown in FIG. 4. There a series resonance circuit is formed with the inductance element L, the capacitor C and the resistor R. That circuit is connected in parallel to the woofer 1. In this case, the transfer characteristic and the impedance characteristic are as indicated in FIGS. 5 and 6, respectively. As a result, substantially the same effect as that in the first example shown in FIG. 1 can be obtained.

As was described above, in the mobile loudspeaker system using the present invention, the peak in the middle frequency range which occurs in a conventional mobile loudspeaker system on a vehicle door is eliminated. Specifically, the middle frequency range of the frequency characteristic of sound pressure is made flat.

What is claimed is:

1. A mobile compound loudspeaker system mounted in the passenger compartment of a vehicle, said system comprising at least a first middle/low frequency loudspeaker for reproducing middle/low frequency sound, and a second loudspeaker for reproducing high frequency sound, said speakers being mounted on a vehicle door of said vehicle, and a first circuit comprising parallel conductors for connecting said middle/low frequency speaker to a signal source, said second loudspeaker being connected by a second circuit across said parallel conductors of said first middle/low frequency loudspeaker, said first circuit including a filter comprised by a first inductance element and a first capacitor, wherein said first capacitor is connected to said conductors in parallel with said first middle/low frequency speaker, said system further comprising:

a resonance circuit connected in said first circuit in series between said first inductance element and said first capacitor of said filter for said middle/low frequency speaker to suppress enhancement in a middle-frequency range in a frequency characteristic of sound pressure.

2. A mobile compound loudspeaker system as claimed in claim 1, in which said resonance circuit increases the impedance of said first circuit for signals in said middle-frequency range.

3. A mobile compound loudspeaker system as claimed in claim 2, in which said resonance circuit is a parallel circuit of an inductance element, a resistor, and a capacitor.

4. A mobile compound loudspeaker system mounted in the passenger compartment of a vehicle, said system comprising:

a first middle/low frequency loudspeaker for reproducing middle/low frequency sound and a first high frequency loudspeaker for reproducing high frequency sound, said first middle/low frequency loudspeaker and said first high frequency loudspeaker being mounted in one of the right and left vehicle doors of said vehicle;

a second middle/low frequency loudspeaker for reproducing middle/low sound and a second high frequency loudspeaker for reproducing high frequency sound, said second middle/low frequency loudspeaker and said second high frequency loudspeaker being mounted in the other of the right and left vehicle doors of said vehicle;

a first circuit comprising a first set of parallel conductors for connecting said first middle/low frequency speaker to a signal source, said first high frequency speaker being connected by a second circuit across said first set of parallel conductors of said first middle/low frequency loudspeaker, said first circuit including a first filter comprised by a first inductance element and a first capacitor, wherein said first capacitor is connected to said first set of conductors in parallel with said first middle/low frequency speaker;

a first resonance circuit connected in said first circuit in series between said first inductance element and said first capacitor of said first filter for said first middle/low frequency speaker to suppress enhancement in a middle-frequency range in a frequency characteristic of sound pressure;

a third circuit comprising a further set of parallel conductors for connecting said second middle/low frequency speaker to the signal source, said second high frequency speaker being connected by a fourth circuit across said further set of parallel conductors of said second middle/low frequency loudspeaker, said third circuit including a second filter comprised by a second inductance element and a second capacitor, wherein said second capacitor is connected to said further set of conductors in parallel with said second middle/low frequency speaker; and a second resonance circuit connected in said third circuit in series between said second inductance element and said second capacitor of said second filter for said second middle/low frequency speaker to suppress enhancement in a middle-frequency range in a frequency characteristic of sound pressure.

* * * * *